United States Patent
Chou et al.

(10) Patent No.: US 9,202,701 B1
(45) Date of Patent: Dec. 1, 2015

(54) METHOD FOR MANUFACTURING SILICON—OXIDE—NITRIDE—OXIDE—SILICON (SONOS) NON-VOLATILE MEMORY CELL

(71) Applicant: UNITED MICROELECTRONICS CORP., Hsin-Chu (TW)

(72) Inventors: Kun-I Chou, Tainan (TW); Chi-Cheng Huang, Kaohsiung (TW); Yu-Chun Chang, Taichung (TW); Ling-Hsiu Chou, Tainan (TW); Tseng-Fang Dai, Tainan (TW); Jheng-Jie Huang, Nantou County (TW); Ping-Chia Shih, Tainan (TW)

(73) Assignee: UNITED MICROELECTRONICS CORP., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 14/572,805

(22) Filed: Dec. 17, 2014

(51) Int. Cl.
*H01L 21/336* (2006.01)
*H01L 21/28* (2006.01)
*H01L 27/115* (2006.01)

(52) U.S. Cl.
CPC .... *H01L 21/28282* (2013.01); *H01L 27/11568* (2013.01)

(58) Field of Classification Search
CPC ............. H01L 2924/00; H01L 2924/0002; H01L 27/11521; H01L 29/792; H01L 27/11524; H01L 29/66833; H01L 21/28282; H01L 27/11568; H01L 2224/32145; H01L 21/76224; H01L 2224/16145; H01L 27/1157

USPC .......... 438/257, 263–264, 287–288, 423, 594
See application file for complete search history.

(56) References Cited

U.S. PATENT DOCUMENTS

| 8,409,950 | B1 | 4/2013 | Shea | |
|---|---|---|---|---|
| 8,546,226 | B2 | 10/2013 | Wang | |
| 2002/0197823 | A1* | 12/2002 | Yoo | H01L 21/76232 438/424 |
| 2004/0110390 | A1* | 6/2004 | Takagi | H01L 27/105 438/710 |
| 2006/0281261 | A1* | 12/2006 | Kim | H01L 21/76224 438/264 |
| 2007/0264793 | A1* | 11/2007 | Oh | H01L 27/11568 438/427 |
| 2008/0173930 | A1* | 7/2008 | Watanabe | H01L 21/28273 257/321 |

* cited by examiner

Primary Examiner — Thanh T Nguyen
(74) Attorney, Agent, or Firm — Winston Hsu; Scott Margo

(57) ABSTRACT

A method for manufacturing a silicon-oxide-nitride-oxide-silicon non-volatile memory cell includes following steps. An implant region is formed in a substrate. A first oxide layer, a nitride layer, and a second oxide layer are formed and stacked on the substrate. A density of the second oxide layer is higher than a density of the first oxide layer. A first photoresist pattern is formed on the second oxide layer and corresponding to the implant region. A first wet etching process is then performed to form an oxide hard mask. A second wet etching process is performed to remove the nitride layer exposed by the oxide hard mask to form a nitride pattern. A cleaning process is then performed to remove the oxide hard mask and the first oxide layer exposed by the nitride pattern, and a gate oxide layer is then formed on the nitride pattern.

10 Claims, 13 Drawing Sheets

METHOD FOR MANUFACTURING SILICON—OXIDE—NITRIDE—OXIDE—SILICON (SONOS) NON-VOLATILE MEMORY CELL

BACKGROUND OF THE INVENTION

1. Field of the Invention

The present invention relates to a method for manufacturing a non-volatile memory cell, and more particularly, to a method for manufacturing a silicon-oxide-nitride-oxide-silicon (hereinafter abbreviated as SONOS) non-volatile memory cell.

2. Description of the Prior Art

Semiconductor memory devices are generally used in computers and electrical products as a means for retaining digital information. Typically, the semiconductor memory devices can be divided into volatile and non-volatile memory devices depending on whether the data stored in the memory devices is completely lost or not in case of power interruption. And the non-volatile memory devices, which can retain data even when the power supply is interrupted, have been widely employed.

In the conventional non-volatile memory technology, a SONOS memory structure is to build a silicon nitride layer sandwiched between two silicon oxide layers for serving as a charge trapping layer while the two silicon oxide layers serve as a charge tunnel layer and a charge block layer respectively. This oxide-nitride-oxide (ONO) multilayered structure is further formed between a semiconductor silicon substrate and a silicon gate, and thus a SONOS memory structure is constructed.

In the electric device including a plurality of SONOS non-volatile memory cells, it is hard to reduce the distance between two adjacent SONOS non-volatile memory cells because some dimension tolerance have to be reserved for the consideration of manufacturing process margin and keeping two adjacent SONOS non-volatile memory cell from overlapping with each other. For instance, the ONO multilayered structure is generally defined by dry etching process and a pad oxide layer has to be used and partially overlapped by the ONO multilayered structure during the dry etching process for protecting the substrate. However, the overlap region between the pad oxide layer and the ONO multilayered structure makes it difficult to reduce the distance between two adjacent SONOS non-volatile memory cells and there will be problems for being applied in more advantage technology node.

SUMMARY OF THE INVENTION

According to the claimed invention, a method for manufacturing a silicon-oxide-nitride-oxide-silicon (SONOS) non-volatile memory cell is provided. According to the method, an implant region is formed in a substrate. A first oxide layer, a nitride layer, and a second oxide layer are then formed and stacked on the substrate. A density of the second oxide layer is higher than a density of the first oxide layer. A first photoresist pattern is formed on the second oxide layer. The first photoresist pattern is formed corresponding to the implant region, and the first photoresist pattern exposes a portion of the second oxide layer. A first wet etching process is then performed to remove the second oxide layer exposed by the first photoresist pattern so as to form an oxide hard mask, and the oxide hard mask exposes a portion of the nitride layer. The first photoresist pattern is then removed, and a second wet etching process is performed to remove the nitride layer exposed by the oxide hard mask so as to form a nitride pattern. The nitride pattern exposes a portion of the first oxide layer. A cleaning process is then performed to remove the oxide hard mask and the first oxide layer exposed by the nitride pattern, and a gate oxide layer is then formed on the nitride pattern.

According to the method for manufacturing a SONOS non-volatile memory cell provided by the present invention, an ONO structure is mainly defined by wet etching processes, and there is no pad oxide layer overlapped by the ONO structure. The ONO structure can be disposed corresponding to a tunnel implant region in the substrate, the distance between two SONOS non-volatile memory cell may be reduced, and the device integrity may be increased accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-10 are schematic drawings illustrating the method for manufacturing the SONOS non-volatile memory cell according to the first preferred embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
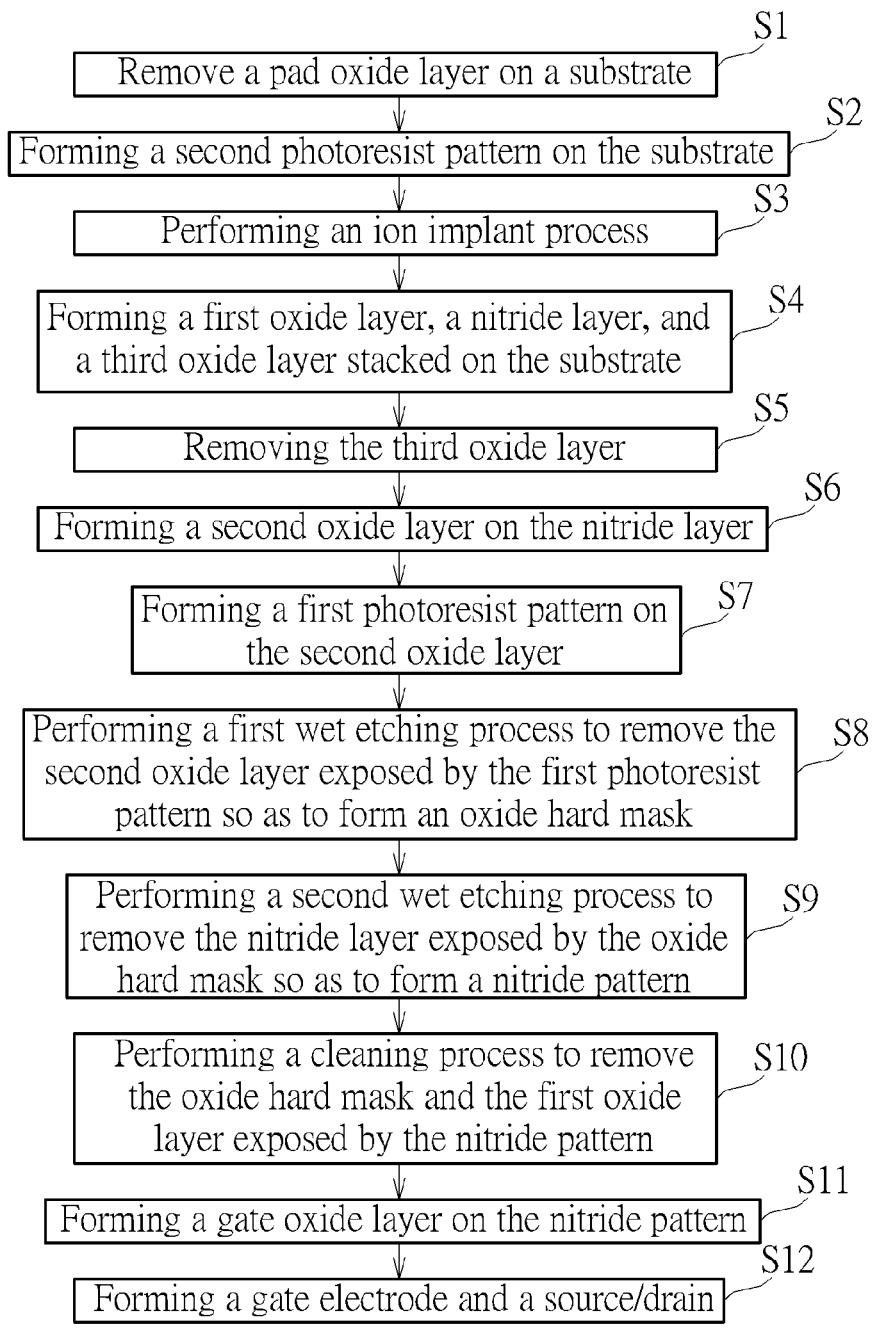
FIG. 1 is a flow chart of a method for manufacturing a SONOS non-volatile memory cell according to a first preferred embodiment of the present invention.
Figure 2:
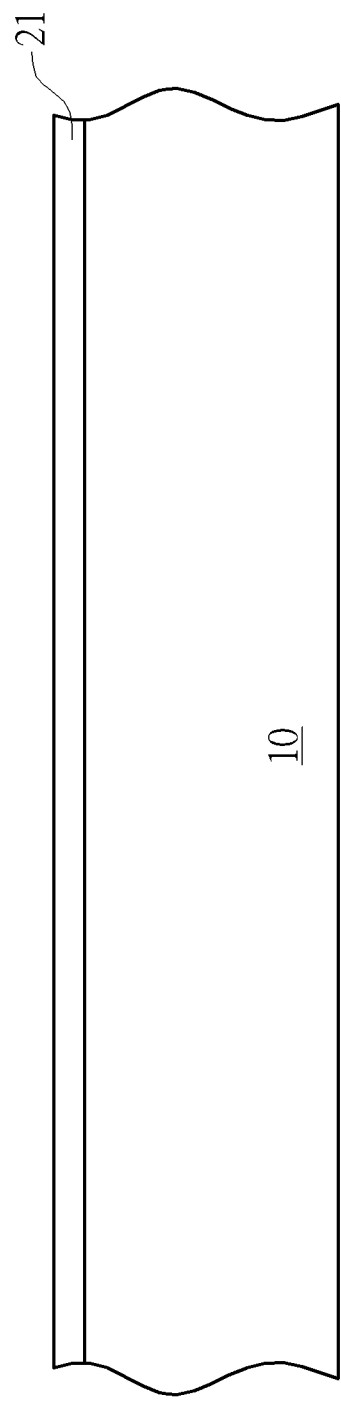
Figure 9:
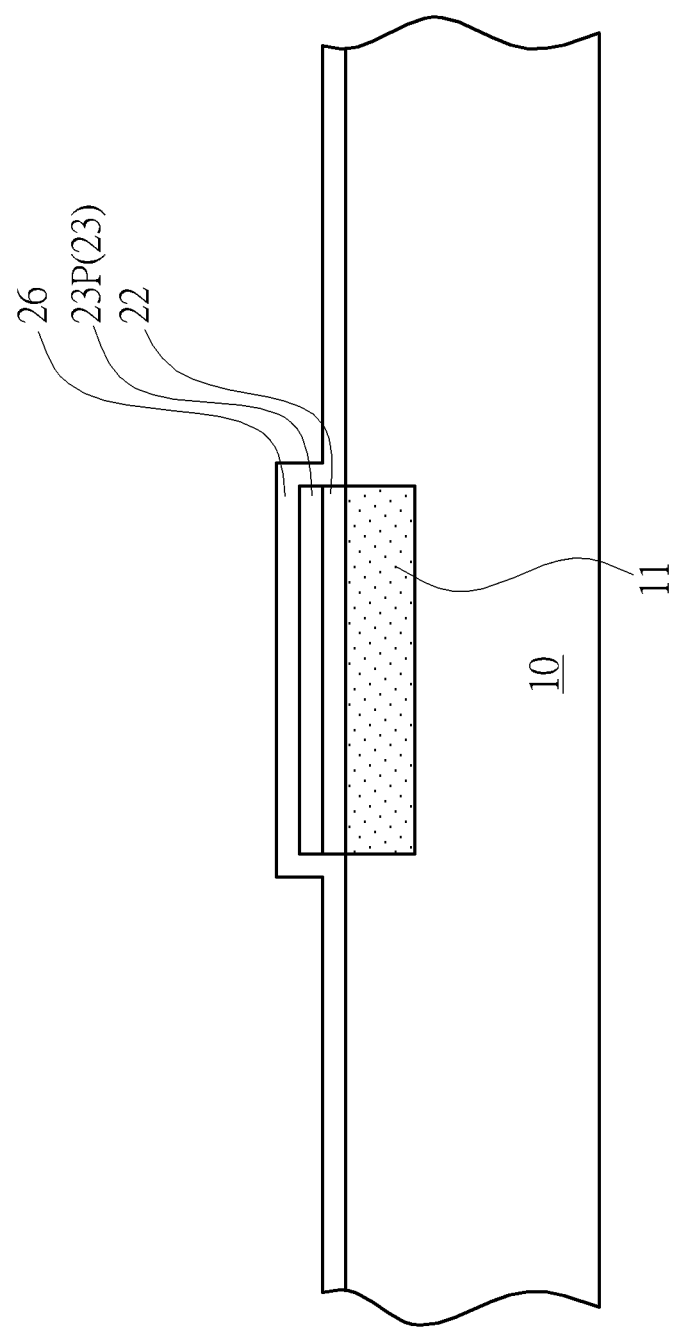
Figure 10:
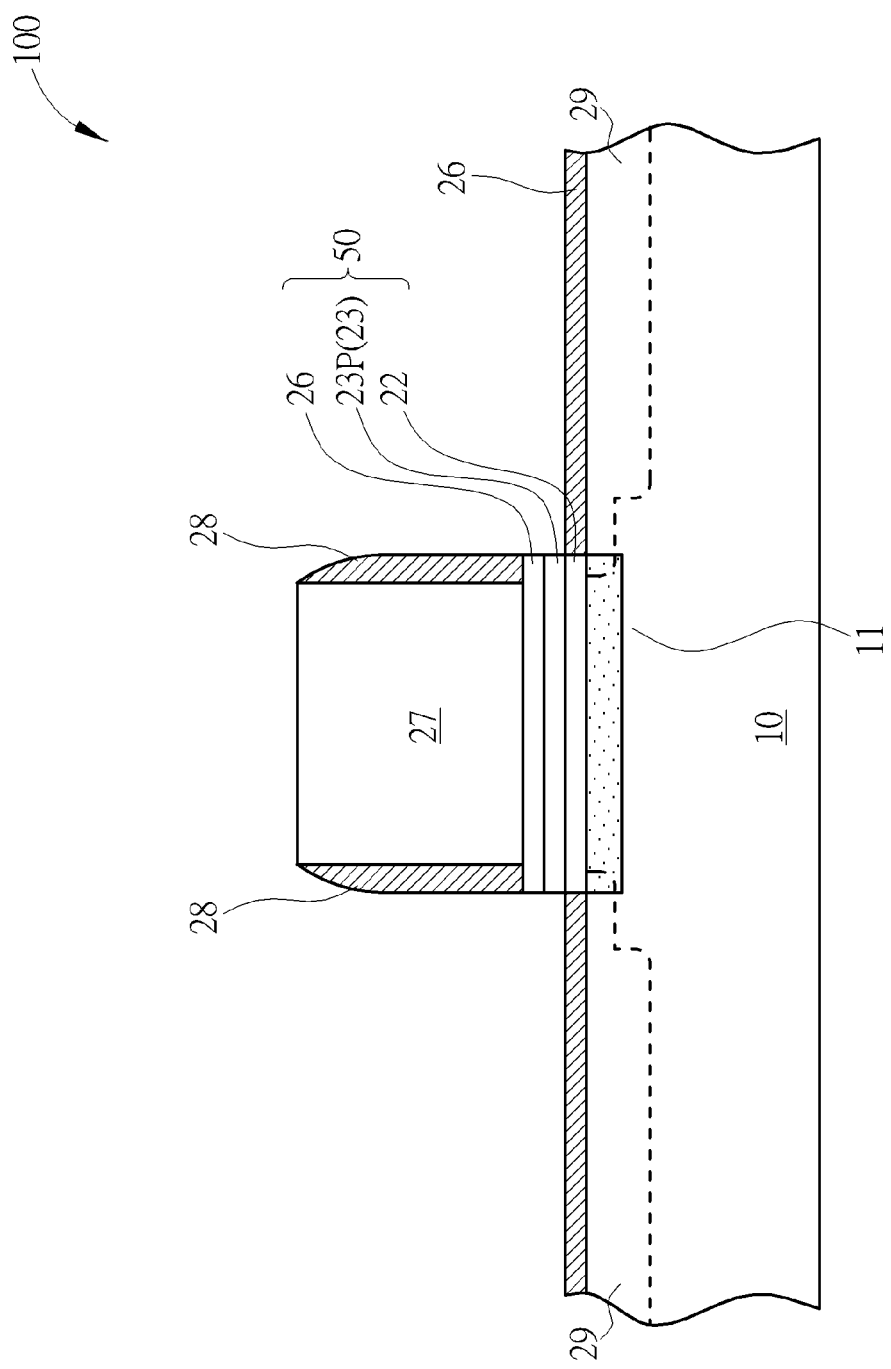
Figure 11:
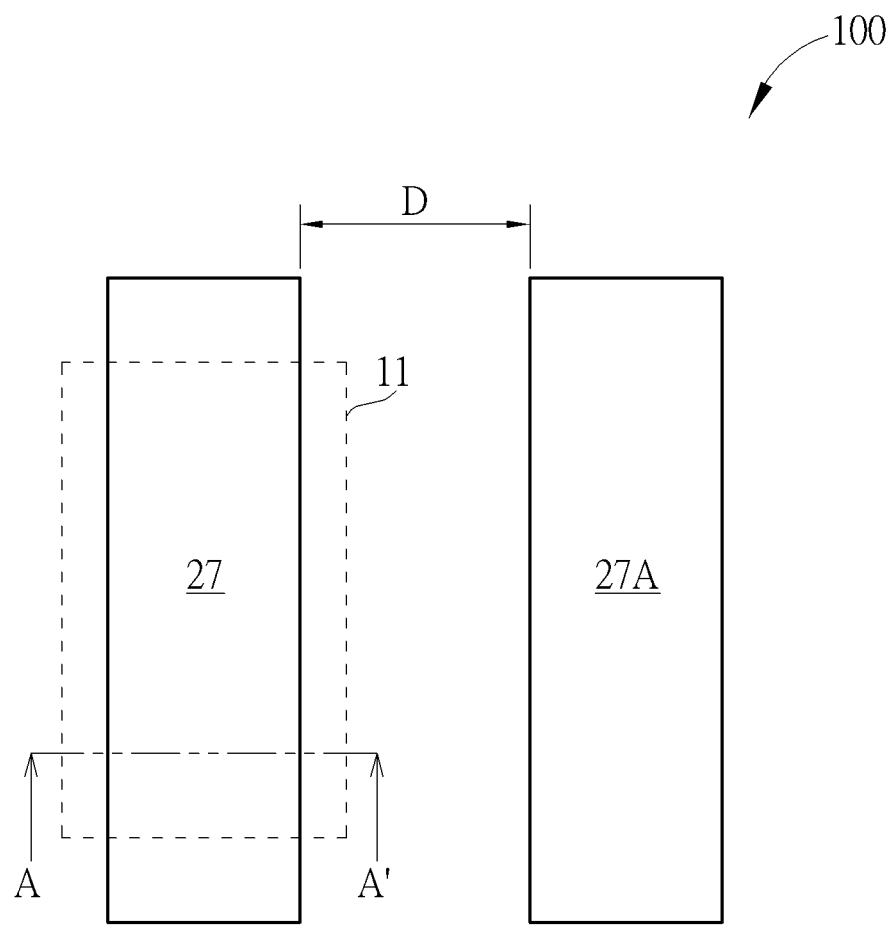
FIG. 11 is a schematic drawing illustrating a top view of the SONOS non-volatile memory cell according to the first preferred embodiment of the present invention.

Please refer to FIGS. 1-11. FIG. 1 is a flow chart of a method for manufacturing a SONOS non-volatile memory cell according to a first preferred embodiment of the present invention. FIGS. 2-10 are schematic drawings illustrating the method of this embodiment. FIG. 11 is a schematic drawing illustrating a top view of the SONOS non-volatile memory cell in this embodiment. The method for manufacturing the SONOS non-volatile memory cell in this embodiment includes the following steps. As shown in FIG. 1 and FIG. 2, in step S1, a substrate 10 with a pad oxide layer 21 formed thereon is provided. The pad oxide layer 21 may be used in other processes such as process for forming shallow trench isolation (STI) loops or threshold voltage implant loops, but not limited thereto. The pad oxide layer 21 is then removed from the substrate 10 before performing subsequent steps. It is worth noting that the pad oxide layer 21 on the region of the SONOS non-volatile memory cell has to be removed in this embodiment, but the pad oxide layer 21 on regions for other devices on the substrate 10 may still remain if necessary.

Figure 3:
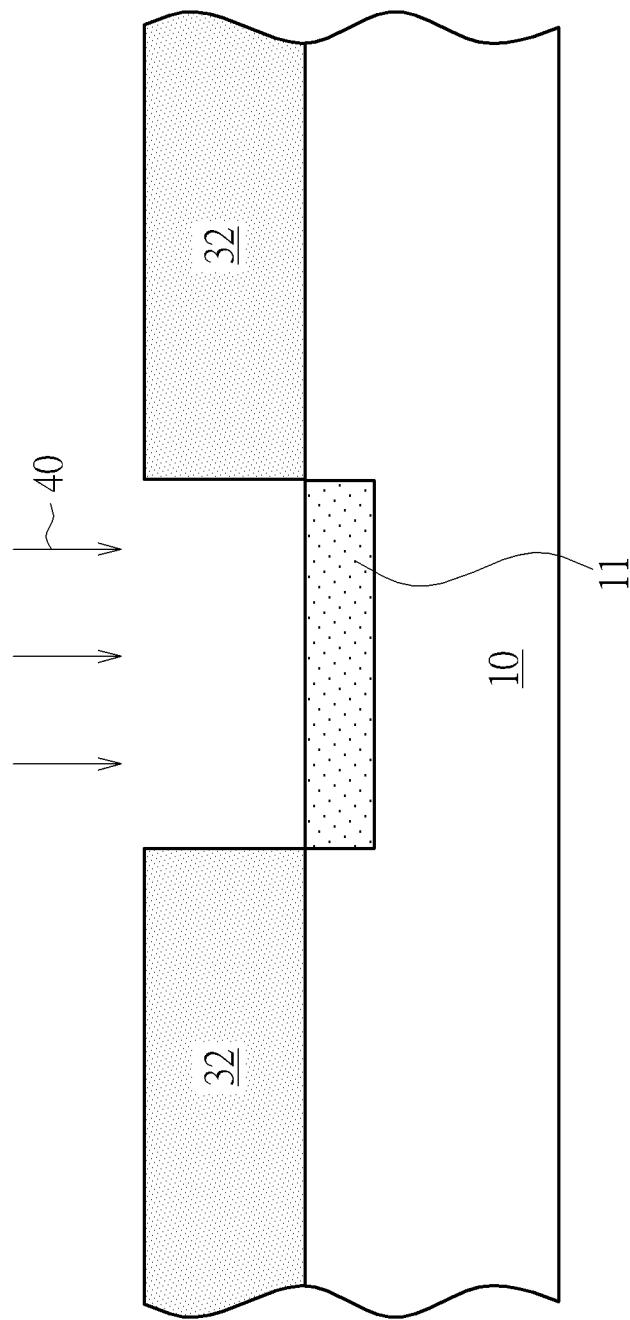

As shown in FIG. 1 and FIG. 3, after a cleaning process (optional), an implant region 11 is formed in the substrate. More specifically, the formation of the implant region 11 may include following steps. In step S2, a second photoresist pattern 32 is formed on the substrate 10, and the second photoresist pattern 32 is directly in contact with the substrate 10 preferably and the second photoresist pattern 32 exposes a portion of the substrate 10. Subsequently, in step S3, ion implant process 40 is performed on the substrate 10 exposed by the second photoresist pattern 32 so as to form the implant region 11 in the substrate 10. The implant region 11 of this embodiment may be regarded as a memory window implant region, a tunnel implant region, or bit lines. The second photoresist layer 32 is removed after the ion implant process 40.

Figure 4:
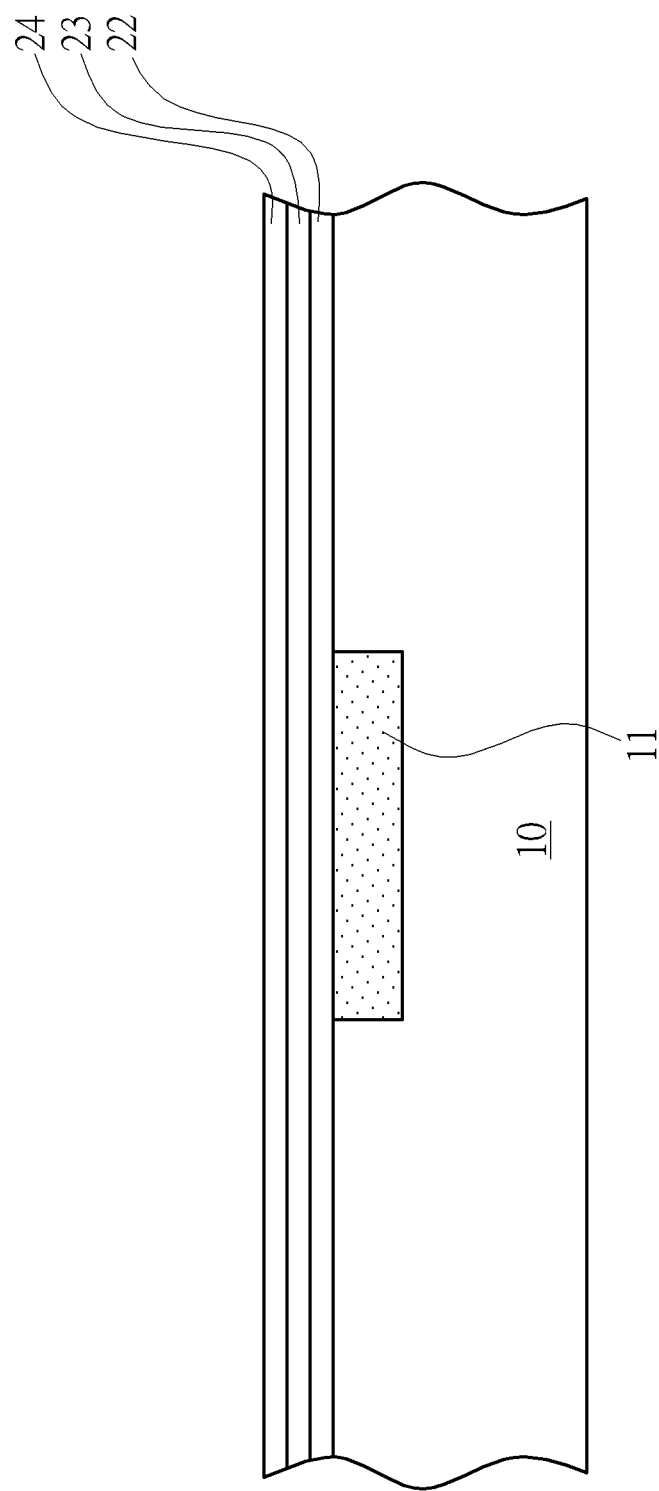

As shown in FIG. 1, FIG. 4, in step S4, a first oxide layer 22, a nitride layer 23, and a third oxide layer 24 is sequentially formed and stacked on the substrate 10. More specifically, the first oxide layer 22 is located between the substrate 10 and the nitride layer 23, and the nitride layer 23 is sandwiched between the first oxide layer 22 and the third oxide layer 24. The first oxide layer 22, the nitride layer 23, and the third oxide layer 24 are formed sequentially by one deposition process preferably, but not limited thereto. Next, in step 5, the third oxide layer 24 is removed. The third oxide layer 24 may be formed by a high temperature oxide (HTO) process, but not limited thereto. The third oxide layer 24 may be used as a treatment to the nitride layer 23, or the third oxide layer 24 may still remain on other regions such as IO regions (not shown) or core regions (not shown) on the substrate 10, but the present invention is not limited to this.

Figure 5:
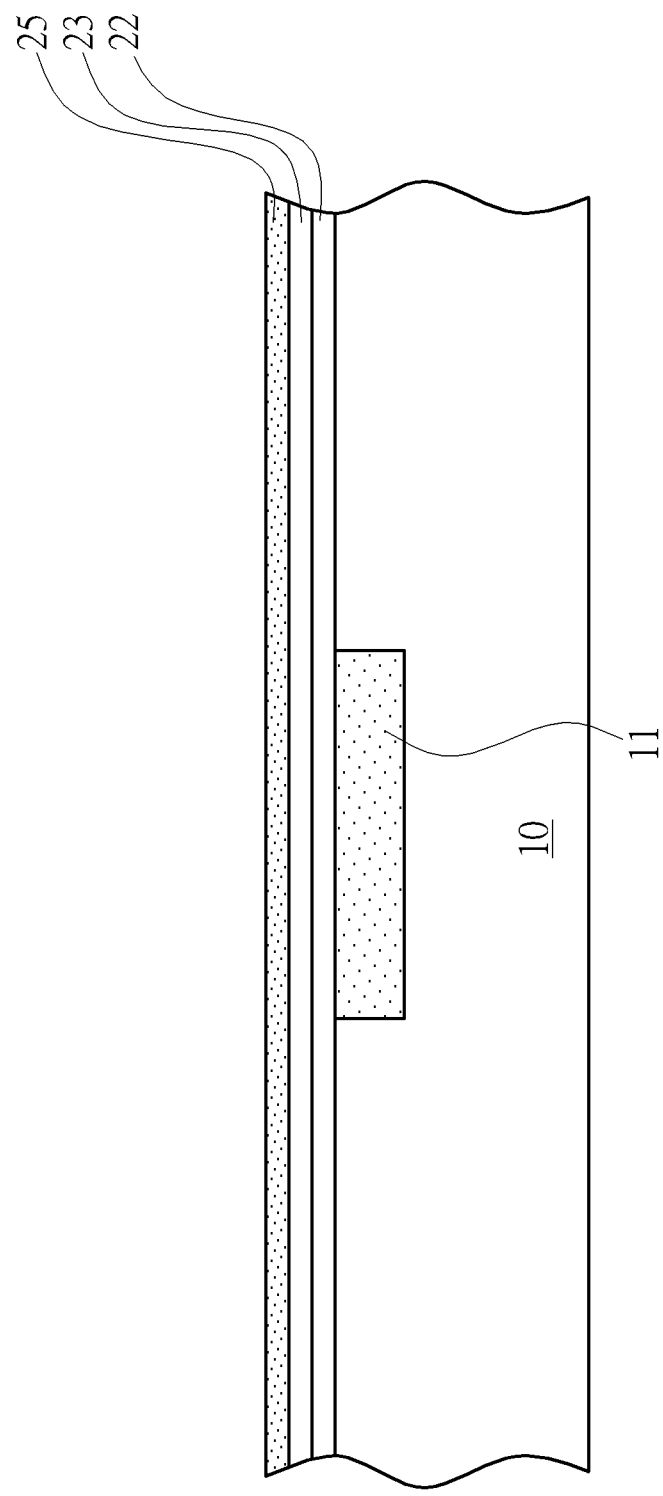

As shown in FIG. 1 and FIG. 5, in step S6, a second oxide layer 25 is formed on the nitride layer 23. In other words, the first oxide layer 22, the nitride layer 23, and the second oxide layer 25 are formed and stacked on the substrate 10. The third oxide layer (not shown in FIG. 5) is formed on the nitride layer 23 before the step of forming the second oxide layer 25, and the third oxide layer is removed before the step of forming the second oxide layer 25. It is worth noting that a density of the second oxide layer 25 is higher than a density of the first oxide layer 22 or/and a density or the third oxide layer. In other words, the materials are stacked more closely in the second oxide layer 25 than those in the first oxide layer 22 or/and the third oxide layer. Additionally, the second oxide layer 25 is formed by an in situ steam generation (ISSG) oxidation process preferably, but not limited thereto, so as to form an oxide layer with higher density or materials stacked more closely.

Figure 6:
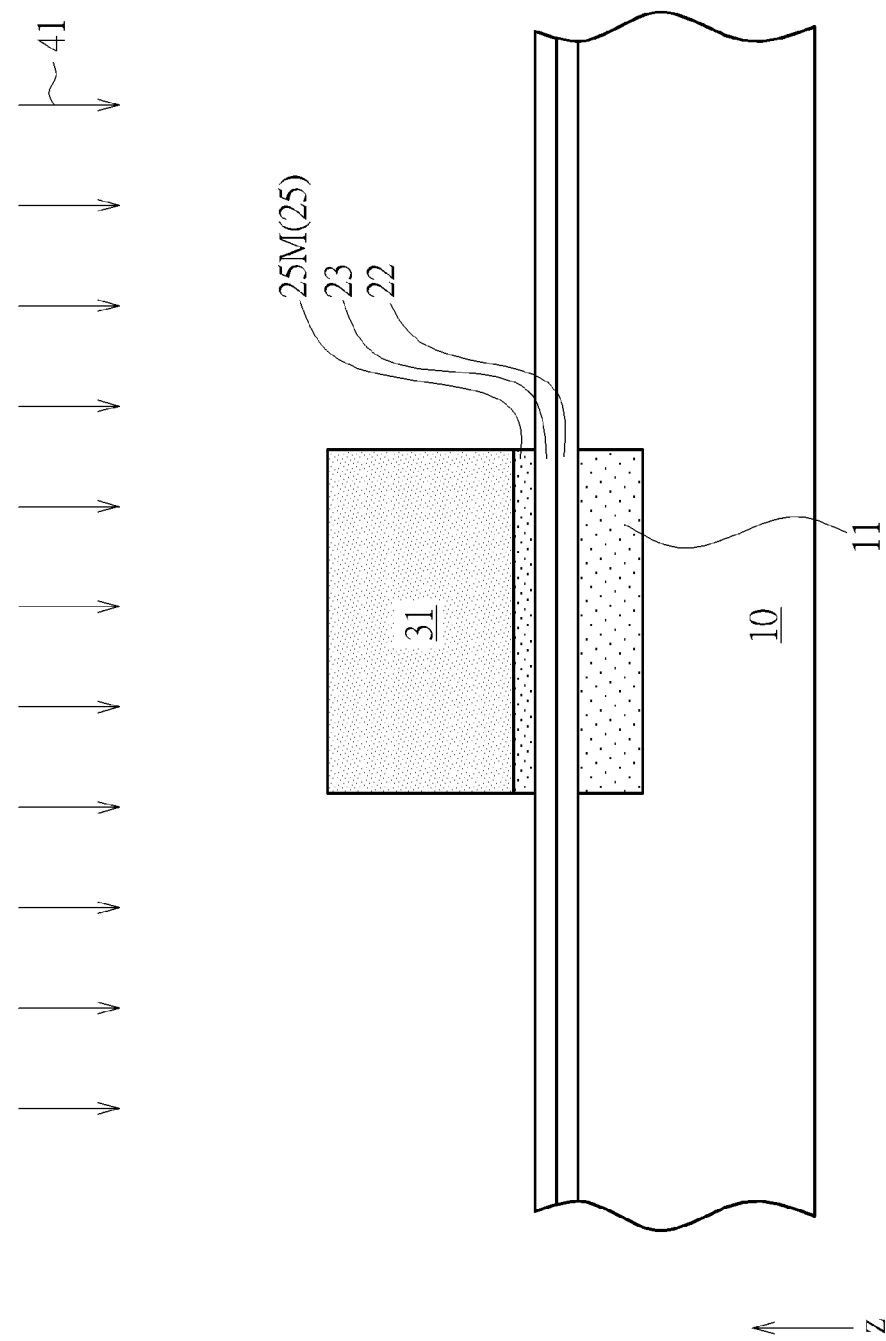

As shown in FIG. 1 and FIG. 6, in step S7, a first photoresist pattern 31 is formed on the second oxide layer 25. The first photoresist pattern 31 is formed corresponding to the implant region 11, and the first photoresist pattern 31 exposes a portion of the second oxide layer 25. The first photoresist layer 31 overlaps the implant region 11 along a vertical projective direction Z. In step S8, a first wet etching process 41 is then performed to remove the second oxide layer 25 exposed by the first photoresist pattern 31 so as to form an oxide hard mask 25M. The oxide hard mask 25M exposes a portion of the nitride layer 23. After the oxide hard mask 25M is formed the first photoresist pattern 31 is removed. Additionally, the second oxide layer 25 exposed by the first photoresist pattern 31 is removed by a buffer oxide etchant (BOE) preferably, but not limited thereto. The BOE may include ammonium fluoride ($NH_4F$) and hydrofluoric acid (HF). In other words, the buffer oxide etchant can be employed in the first wet etching process 41.

Figure 7:
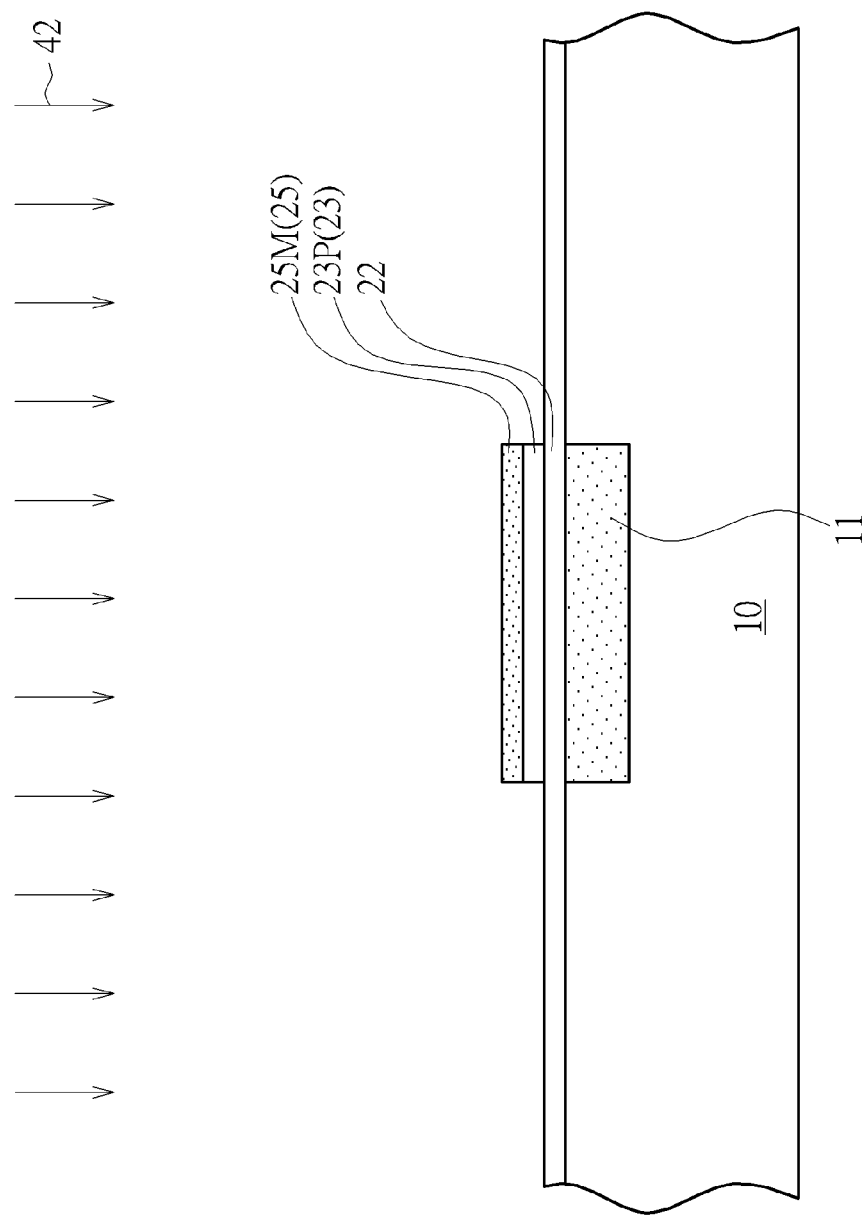

As shown in FIG. 1 and FIG. 7, in step S9, a second wet etching process 42 is then performed to remove the nitride layer 23 exposed by the oxide hard mask 25M so as to form a nitride pattern 23P. The nitride pattern 23P exposes a portion of the first oxide layer 22. In other words, the patterned second oxide layer 25 is used as a hard mask in the second wet etching process 42, and that's why the second oxide layer 25 has to be an oxide layer with higher density or materials stacked more closely. Additionally, a portion of the nitride layer 23 which is not covered by the oxide hard mask 25M is removed by an etchant containing phosphoric acid ($H_3PO_4$) preferably, but not limited thereto.

Figure 8:
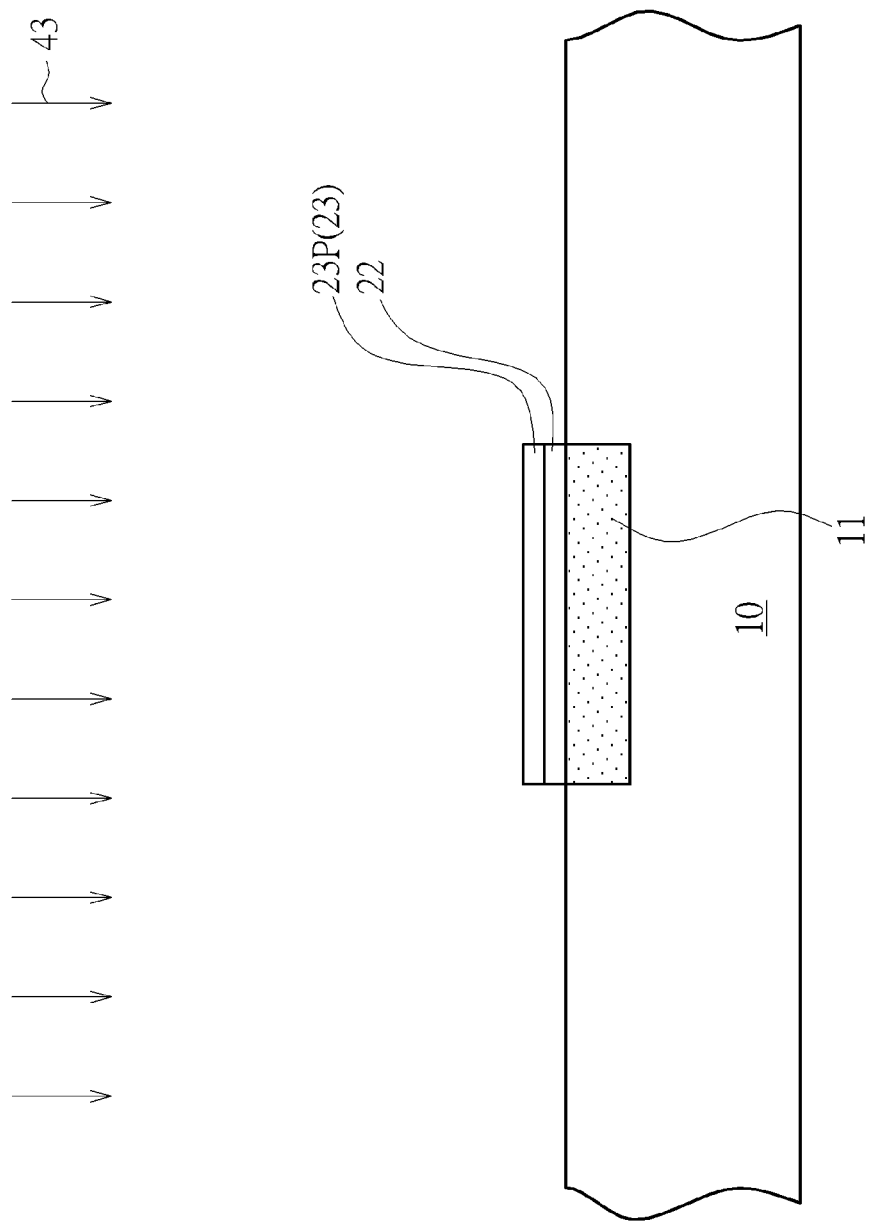

As shown in FIG. 1 and FIG. 8, in step S10, a cleaning process 43 is then performed to remove the oxide hard mask 25M and the first oxide layer 22 exposed by the nitride pattern 23P. The cleaning process 43 may include a RCA cleaning process or other appropriate cleaning process. The RCA cleaning process may include chemicals such as ammonium hydroxide ($NH_4OH$), hydrogen peroxide ($H_2O_2$), hydrochloric acid (HCl), sulfuric acid ($H_2SO_4$) and dilute hydrofluoric acid (DHF). It is worth noting that the first photoresist pattern is removed before the second wet etching process in this embodiment, but the present invention is not limited thereto. In another embodiment of the present invention, the first photoresist pattern may also be removed after the second wet etching process and before the cleaning process.

As shown in FIG. 1 and FIG. 9, in step S11, a gate oxide layer 26 is then formed on the nitride pattern 23P and the substrate 10. As shown in FIG. 1 and FIG. 10, in step S12, a gate electrode 27 and sidewall spacers are formed on the gate oxide layer 26, and a source/drain 29 is formed in the substrate 10 so as to form a SONOS non-volatile memory cell 100 as shown in FIG. 10. In the SONOS non-volatile memory cell 100, an ONO structure 50 is composed of the first oxide layer 22, the nitride pattern 23P, and the gate oxide layer 26. The gate oxide layer 26 may also be disposed on other regions such as IO regions (not shown) or core regions (not shown) on the substrate 10, but not limited thereto.

Please refer to FIG. 11. FIG. 11 is a schematic drawing illustrating a top view of the SONOS non-volatile memory cell 100 in this embodiment, and FIG. 10 may be regarded as a cross-sectional diagram taken along cross-sectional line A-A' in FIG. 11. As shown in FIG. 10 and FIG. 11, a distance D between the gate electrode 27 and another gate electrode 27A can be effectively reduced because the nitride pattern 23P and the first oxide layer 22 in the ONO structure 50 are defined by wet etching. The pad oxide layer is not employed during the processes for forming the ONO structure 50, and the ONO structure 50 can be formed corresponding to the implant region 11 in the substrate 10 for reducing the distance D between the gate electrode 27 and the gate electrode 27A. Additionally, the gate electrode 27A may be a gate electrode of another SONOS non-volatile memory cell or a selecting gate electrode while the gate electrode 27 is a control gate electrode, but not limited thereto.

Figure 12:
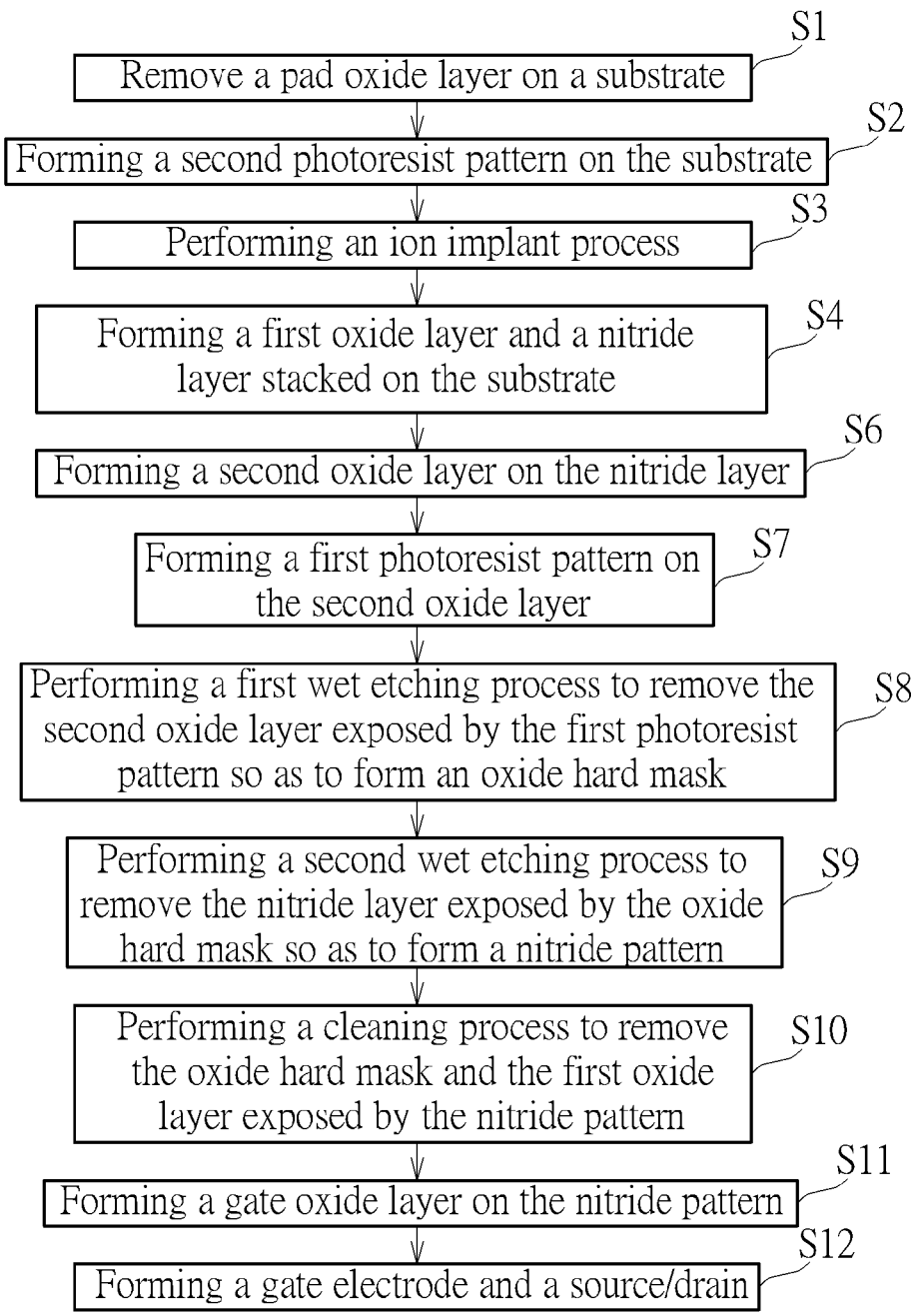
FIG. 12 is a flow chart of a method for manufacturing a SONOS non-volatile memory cell according to a second preferred embodiment of the present invention.
Figure 13:
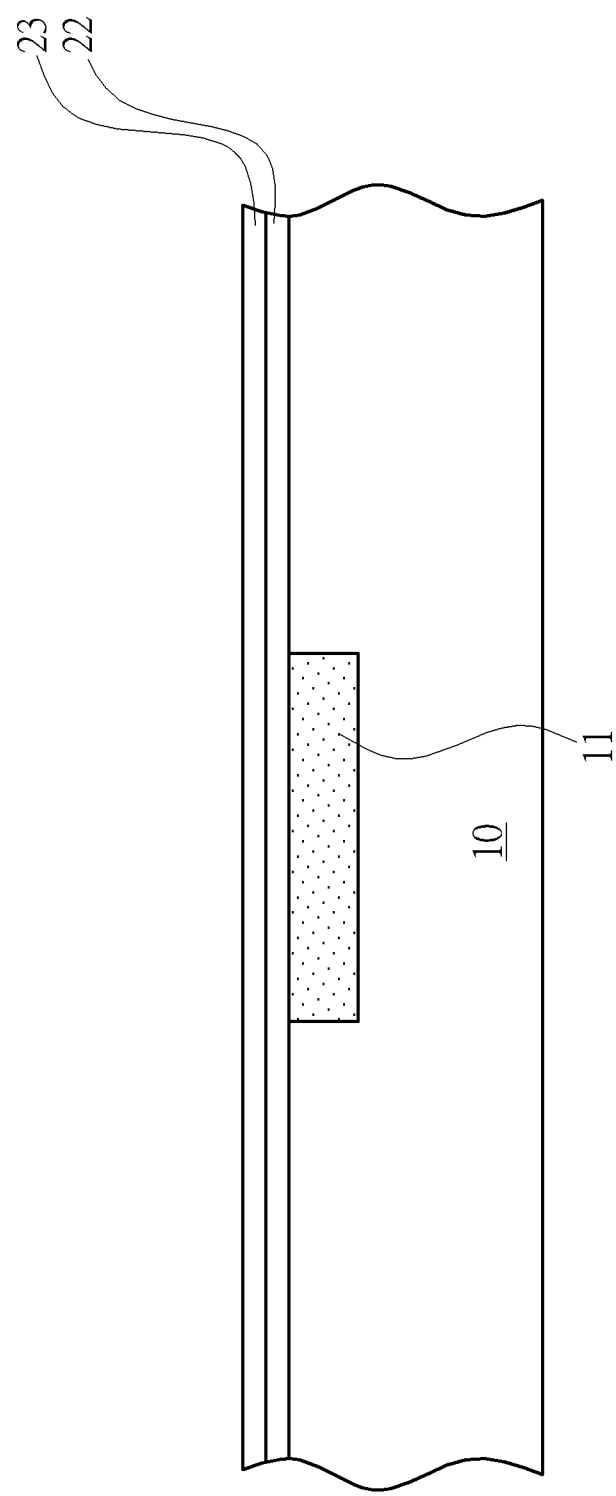
FIG. 13 is a schematic drawing illustrating the method for manufacturing the SONOS non-volatile memory cell according to the second preferred embodiment of the present invention.

Please refer to FIGS. 12, 13 and 5. FIG. 12 is a flow chart of a method for manufacturing a SONOS non-volatile memory cell according to a second preferred embodiment of the present invention. FIG. 13 is a schematic drawing illustrating the method of this embodiment, and FIG. 5 may also be regarded as a schematic drawing in a step subsequent to FIG. 13. As shown in FIG. 12 and FIG. 13, the difference between the method of this embodiment and the method of the above-mentioned first preferred embodiment is that in step S4, only the first oxide layer 22 and the nitride layer 23 are formed and stacked on the substrate 10. In other words, the third oxide layer mentioned in the previous embodiment is not formed in the method of this embodiment. Subsequently, as shown in FIG. 12 and FIG. 5, in step S6, the second oxide layer 25 is formed on the nitride layer 23. In other words, the step S6 (as shown in FIG. 1) in the previous embodiment can be skipped in this embodiment because the third oxide layer is not formed on the nitride layer 23. The steps after the step S6 in this embodiment are similar to those of the first preferred embodiment and will not be redundantly described.

To summarize the above descriptions, in the method for manufacturing the SONOS non-volatile memory cell in this invention, the ONO structure is mainly defined by wet etching processes, and there is no pad oxide layer overlapped by the ONO structure. The region of the ONO structure can be designed to be corresponding to the region of the tunnel implant region in the substrate. The size of individual ONOS non-volatile memory cell shrunken, the distance between two SONOS non-volatile memory cell may be reduced, and the device integrity may be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a silicon-oxide-nitride-oxide-silicon (SONOS) non-volatile memory cell, comprising:
    forming an implant region in a substrate;
    forming a first oxide layer, a nitride layer, and a second oxide layer stacked on the substrate, wherein a density of the second oxide layer is higher than a density of the first oxide layer;
    forming a first photoresist pattern on the second oxide layer, wherein the first photoresist pattern is formed corresponding to the implant region, and the first photoresist pattern exposes a portion of the second oxide layer;
    performing a first wet etching process to remove the second oxide layer exposed by the first photoresist pattern so as to form an oxide hard mask, wherein the oxide hard mask exposes a portion of the nitride layer;
    removing the first photoresist pattern;
    performing a second wet etching process to remove the nitride layer exposed by the oxide hard mask so as to form a nitride pattern, wherein the nitride pattern exposes a portion of the first oxide layer;
    performing a cleaning process to remove the oxide hard mask and the first oxide layer exposed by the nitride pattern; and
    forming a gate oxide layer on the nitride pattern.

2. The method for manufacturing the SONOS non-volatile memory cell according to claim 1, wherein the formation of the implant region comprises following steps:
    forming a second photoresist pattern on the substrate, wherein the second photoresist pattern is directly in contact with the substrate and the second photoresist pattern exposes a portion of the substrate;
    performing an ion implant process on the substrate exposed by the second photoresist pattern; and
    removing the second photoresist pattern.

3. The method for manufacturing the SONOS non-volatile memory cell according to claim 1, further comprising:
    forming a third oxide layer on the nitride layer before forming the second oxide layer, wherein the density of the second oxide layer is higher than a density of the third oxide layer; and
    removing the third oxide layer before forming the second oxide layer, wherein the first oxide layer, the nitride layer, and the third oxide layer are formed sequentially by one deposition process.

4. The method for manufacturing the SONOS non-volatile memory cell according to claim 1, wherein the second oxide layer is formed by an in situ steam generation (ISSG) oxidation process.

5. The method for manufacturing the SONOS non-volatile memory cell according to claim 1, wherein the third oxide layer is formed by a high temperature oxide (HTO) process.

6. The method for manufacturing the SONOS non-volatile memory cell according to claim 1, wherein the second oxide layer exposed by the first photoresist pattern is removed by a buffer oxide etchant (BOE).

7. The method for manufacturing the SONOS non-volatile memory cell according to claim 1, wherein the nitride layer exposed by the oxide hard mask is removed by an etchant containing phosphoric acid ($H_3PO_4$).

8. The method for manufacturing the SONOS non-volatile memory cell according to claim 1, further comprising:
    forming a gate electrode on the gate oxide layer; and
    forming a source/drain in the substrate.

9. The method for manufacturing the SONOS non-volatile memory cell according to claim 1, wherein the first photoresist pattern is removed before the second wet etching process.

10. The method for manufacturing the SONOS non-volatile memory cell according to claim 1, wherein the first photoresist pattern is removed after the second wet etching process.

* * * * *